April 2, 1968 J. D. JONES 3,376,508

U.H.F. AND V.H.F TUNER FOR RECEIVERS

Filed Nov. 3, 1964

Inventor
JAMES DOUGLAS JONES

By
Browne, Schuyler & Beveridge
Attorney

United States Patent Office 3,376,508
Patented Apr. 2, 1968

3,376,508

U.H.F. AND V.H.F. TUNER FOR RECEIVERS

James Douglas Jones, Cambridge, England, assignor to Pye Limited, Cambridge, England Filed Nov. 3, 1964, Ser. No. 408,569
Claims priority, application Great Britain, Nov. 6, 1963, 43,824/63
8 Claims. (Cl. 325—459)

ABSTRACT OF THE DISCLOSURE

The present invention relates to a U.H.F. and V.H.F. tuner for television and radio receivers in which continuously variable tuning elements of the tuned circuits are ganged capacitors, which are associated with lecher wires for U.H.F. operation and wherein inductance coils are connected to U.H.F. nodal points on the lecher wires for V.H.F. operation.

Figures 1, 2:
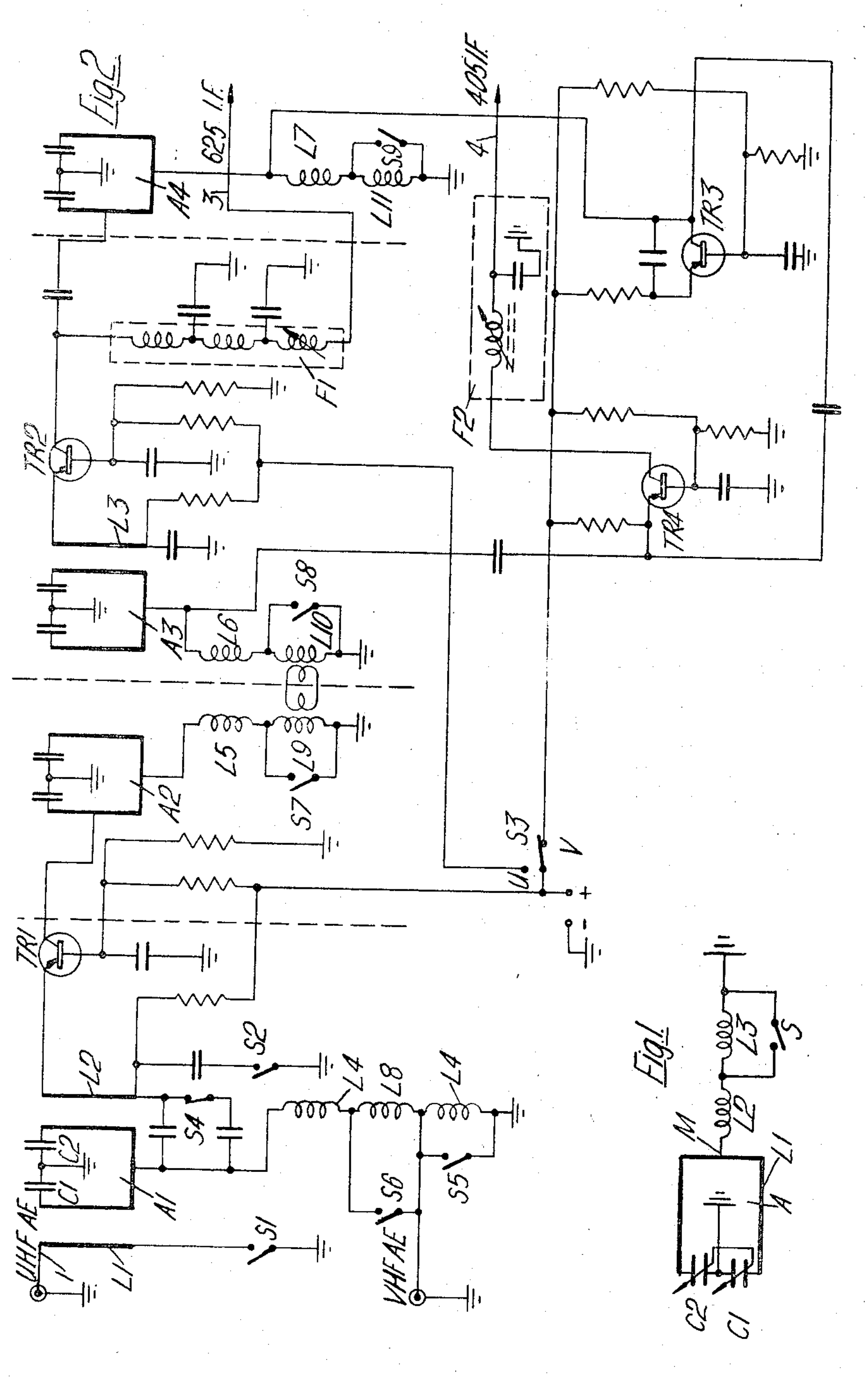

Tuners adapted for tuning a television or radio receiver to a U.H.F. range of frequencies as well as to one or more lower frequency bands have heretofore been found impracticable because of the impossibility of introducing switches into the circuit without also giving rise to stray capacities and change in inductance which seriously affect the tuner in the U.H.F. tuning position.

A feature of the present invention is a tuner unit adapted for the U.H.F. range and for one or more lower frequency bands in which continuously variable tuning elements of the tuned circuits of the unit are ganged capacitors, which for the U.H.F. reception are tuned by lecher wires and wherein inductance coils are adapted to be introduced into the tuned circuits when adapted for the lower frequency bands, the introduction being effected by ganged switches, the arrangement being such that in the U.H.F. reception condition any signal interference caused by stray capacities and/or inductance introduced into the tuned circuits by the switching means is at nodal points in the lecher wires for said U.H.F.

Another feature of the invention is a tuner unit as aforesaid in which the circuits tunable over the U.H.F. range each comprises lecher wires in series with two capacitors whose capacities are adapted to be varied, but always so that they remain equal in each capacitor, the common terminal of the capacitors being taken to earth or equivalent potential, said tuner unit also comprising a set of inductance coils each of which is adapted to be switched in series with a corresponding one of the said tunable circuits at the centre of its lecher wires so that the effect of any stray capacity and/or inductance changes introduced by the switching occurs at a point in the U.H.F. tuned circuit which is a node for the U.H.F. wave therein.

The above and other features of the invention will be more readily understood by a perusal of the following description having reference to the accompanying drawings in which FIGURE 1 is a circuit diagram of a section of a tuner unit according to the invention and illustrates a basic principle thereof and FIGURE 2 is a circuit diagram of one form of tuner unit according to the invention.

In FIGURE 1 a tuned circuit A comprises a loop in the form of a short circuited transmission line or lecher wires L1 serially connected with capacitors C1 and C2 whose common terminal is taken to earth, resonance of the circuit being at the desired U.H.F. frequency. The mid-point M of L1 is connected to coils L2 and L3 the latter being adapted to be short circuited by a switch S. The capacities C1 and C2 are of equal capacity and form elements of ganged capacitors which control the tuning of all the A type circuits of the tuner. The variation of the capacitors is such that whatever the value of C1 and C2 they remain of equal value. The circuit A is tuned to resonance by capacitors C1 and C2 so that the mid-point M is a node for the U.H.F. wave in the circuit. If C1 and C2 ever differed in value from one another M would no longer be a node for the U.H.F. wave and as a result any change in capacity and/or inductance introduced by the switches would appear in the U.H.F. circuit and alter its resonant frequency and/or impair its efficiency. By the arrangement shown any such stray capacity and/or inductance being introduced at a node of the U.H.F. wave in A would not effect the U.H.F. resonant circuit.

FIGURE 2 shows a circuit diagram of a tuner adapted for the reception of U.H.F. and V.H.F. bands dependent upon the position of switching means which in FIGURE 2 are shown in a position for reception of the lowest frequency band. The U.H.F. tuned circuits are indicated as A1 to A4, each similar to A of FIGURE 1. In the U.H.F. position switches S1, S2 and S5 are closed, S4 is open and S3 is on contact U. The switches are jointly operated.

In the U.H.F. position of the switches S1 to S5 U.H.F. signals arriving at 1 energise a coupling loop L1, are passed by A1 via a coupling loop L2 to a transistor TR1, operating as an amplifier, its output being through A2 which is coupled by means not shown to A3. The output of A3 is coupled via loop L3 to a transistorized heterodyne stage in the form of transistor TR2 connected as an oscillator-mixer, whose oscillatory circuit is A4. The I.F. signals are taken off in a lead 3 via a filter F1.

To accommodate a lower frequency band switches S1, S2 and S5 are open, S4 is closed and S3 is on contact V. The circuit shows switches S6, S7, S8 and S9 which are jointly operated and are in the closed position for reception of a V.H.F. band, say band III, coils L4, L5, L6 and L7 being then in series in networks A. In the open position of said switches S6 to S9 the unit is adapted for reception of a lower V.H.F. band, say band I, and coils L8, L9, L10 and L11 are then in series with coils L4 to L7 respectively.

Switches S1 to S9 may be jointly operated and then take the form of three position switches.

In the V.H.F. position an oscillator comprising transistor TR3 and transistor TR4 acting as a mixer are introduced to substitute for TR2 and in this case the I.F. output is taken from a lead 4 via a filter F2.

The screening of the stages of the tuner and inter-stage couplings may be on the basis of normal techniques and are indicated in part, diagrammatically in FIGURE 2.

The lead 3 may be adapted to provide an I.F. for a 625 channel and lead 4 for an I.F. for a 405 channel, or the lead 3 and 4 may be connected together to feed to a common I.F. channel.

I claim:

1. A tuner unit with switchable tuned circuits for adapting the unit to respond to U.H.F. input signals and at least one range of V.H.F. input signals and comprising switching means for controlling the response of each tuned circuit, said tuned circuits comprising lecher wires whose ends are each connected through similar capacitors to earth or like reference potential, which lecher wires in the U.H.F. responsive switch position tune the unit to U.H.F. signals, at least one inductance coil corresponding to each tunable circuit and being connected to a U.H.F. nodal point on the lecher wires in the V.H.F. responsive switch position and said switching means further comprising a member which in the U.H.F. reception position couples the unit to said U.H.F. input signals and which in an alternative position uncouple the unit to said U.H.F. input signals.

2. A tuner unit according to claim 1 in which the said tuned circuits are situated respectively in the input of an R.F. amplifier stage and in the output of the amplifier stage between said R.F. amplifier stage and a heterodyne stage.

3. A tuner unit with switchable tuned circuits for adapting the unit to respond to U.H.F. input signals and at least one range of V.H.F. input signals and comprising switching means for controlling the response of each tuned circuit, said tuned circuits comprising lecher wires whose ends are each connected through similar capacitors to earth or like reference potential, which lecher wires in the U.H.F. responsive switch position tune the unit to U.H.F. signals, a set of inductance coils corresponding to each tunable circuit, the coils of each set being connected serially to a U.H.F. nodal point on the lecher wires in the V.H.F. responsive switch position and the switching means being adapted to short circuit selected inductance coils of each set to tune the unit to predetermined V.H.F. signal frequencies and disable to U.H.F. signal input.

4. A tuner unit according to claim 3 in which the said tuned circuits are situated respectively in the input of an R.F. amplifying stage and in the output of the amplifier stage between said R.F. amplifier stage and a heterodyne stage.

5. In a tuner unit, a first circuit tunable to a U.H.F. signal band, an amplifier stage coupled to first said tunable circuit, a second similarly tunable circuit in the output of said amplifier and coupled to a heterodyning stage, a third tunable circuit, ganged with the first and second tunable circuits, in said heterodyning stage, lecher wires constituting a part of each said tunable circuit, at least one inductance coil introduced between earth or equivalent potential and a nodal point at U.H.F. of each lecher wire and adapted in combination with said tunable circuits to resonate at a lower frequency and switching means associated with each tunable circuit and controlling the effect of said inductance coils on said tunable circuits.

6. A tuner unit as claimed in claim 5, in which the switching means also serves to make ineffective a U.H.F. input signal coupling circuit and to connect the V.H.F. input signals to the tuner unit when operating at lower frequency, and to disconnect a V.H.F. coupling circuit and makes effective the U.H.F. input signal coupling circuit when operating at U.H.F.

7. A tuner unit as claimed in claim 5, in which each tunable circuit comprises a lecher wire formed as a loop whose ends are connected to two identical ganged capacitors having a common terminal which is connected to earth or equivalent potential, and wherein said capacitors are effectively in series for U.H.F. operation and in parallel for V.H.F. operation.

8. In a tuner unit adapted to be tunable to respond to U.H.F. input signals and to at least one range of V.H.F. input signals, in combination a lecher wire and a variable capacitor constituting a tunable circuit for operating at the U.H.F., an inductance coil adapted, when introduced into said tunable circuit, to resonate therewith at a lower frequency, and switching means associated with said coil to make such introduction effective, said coil being introduced between earth or equivalent potential and a nodal point at U.H.F. on the lecher wire.

References Cited

UNITED STATES PATENTS

| | | | |
|---|---|---|---|
| 2,964,626 | 12/1960 | Webster et al. | 333—824 XR |
| 3,252,095 | 5/1966 | Carlson | 325—459 |

WILLIAM C. COOPER, *Primary Examiner.*

KATHLEEN H. CLAFFY, *Examiner.*

R. LINN, *Assistant Examiner.*